(12) United States Patent
Wernersson et al.

(10) Patent No.: US 10,361,284 B2
(45) Date of Patent: Jul. 23, 2019

(54) METHOD FOR VERTICAL GATE-LAST PROCESS

(71) Applicants: Lars-Erik Wernersson, Lund (SE);
Johannes Svensson, Lund (SE);
Martin Berg, Lund (SE);
Karl-Magnus Persson, Lund (SE);
Erik Lind, Lund (SE)

(72) Inventors: Lars-Erik Wernersson, Lund (SE);
Johannes Svensson, Lund (SE);
Martin Berg, Lund (SE);
Karl-Magnus Persson, Lund (SE);
Erik Lind, Lund (SE)

( * ) Notice: Subject to any disclaimer, the term of this patent is extended or adjusted under 35 U.S.C. 154(b) by 0 days.

(21) Appl. No.: 15/738,274

(22) PCT Filed: Jun. 21, 2016

(86) PCT No.: PCT/EP2016/064241
§ 371 (c)(1),
(2) Date: Dec. 20, 2017

(87) PCT Pub. No.: WO2016/207127
PCT Pub. Date: Dec. 29, 2016

(65) Prior Publication Data
US 2018/0219084 A1 Aug. 2, 2018

(30) Foreign Application Priority Data
Jun. 22, 2015 (SE) ...................... 1530097

(51) Int. Cl.
*H01L 29/66* (2006.01)
*B82Y 10/00* (2011.01)
(Continued)

(52) U.S. Cl.
CPC ........ *H01L 29/66666* (2013.01); *B82Y 10/00* (2013.01); *B82Y 40/00* (2013.01);
(Continued)

(58) Field of Classification Search
CPC ......... H01L 29/66666; H01L 29/66522; H01L 29/068; H01L 29/0676; H01L 29/775;
(Continued)

(56) References Cited

U.S. PATENT DOCUMENTS 8,115,344 B2 * 2/2012 Feng .................... H01H 1/0094
307/112
2013/0240983 A1 9/2013 Larrieu
(Continued)

FOREIGN PATENT DOCUMENTS

EP 2383785 A2 11/2011
WO 2014006503 A2 1/2014

OTHER PUBLICATIONS

International Search Report and Written Opinion from International Application No. PCT/EP2016/064241 dated Sep. 21, 2016, 13 pages.
(Continued)

*Primary Examiner* — William Coleman
(74) *Attorney, Agent, or Firm* — Brundidge & Stanger, P.C.

(57) ABSTRACT

A method for fabrication of vertical nanowire MOSFETs is considered using a gate-last process. The top ohmic electrode is first fabricated and may be used as a mask to form a gate recess using etching techniques. The gate is thereafter formed allowing a large degree in access resistance reduction.

15 Claims, 2 Drawing Sheets

(51) Int. Cl.
   *B82Y 40/00* (2011.01)
   *H01L 29/40* (2006.01)
   *H01L 29/423* (2006.01)
   *H01L 29/739* (2006.01)
   *H01L 29/775* (2006.01)
   *H01L 29/06* (2006.01)

(52) U.S. Cl.
   CPC ........ *H01L 29/068* (2013.01); *H01L 29/0676* (2013.01); *H01L 29/401* (2013.01); *H01L 29/42376* (2013.01); *H01L 29/66469* (2013.01); *H01L 29/66522* (2013.01); *H01L 29/7391* (2013.01); *H01L 29/775* (2013.01)

(58) Field of Classification Search
   CPC ........... H01L 29/7391; H01L 29/66469; H01L 29/42376; H01L 29/401; B82Y 40/00; B82Y 10/00
   See application file for complete search history.

(56) References Cited

U.S. PATENT DOCUMENTS

| | | |
|---|---|---|
| 2013/0307037 A1 | 11/2013 | Masuoka et al. |
| 2013/0313525 A1 | 11/2013 | Rosaz et al. |
| 2015/0060996 A1 | 3/2015 | Colinge et al. |
| 2015/0069501 A1 | 3/2015 | Colinge et al. |

OTHER PUBLICATIONS

Search Report from SE1530097-3 dated Jan. 22, 2016, 5 pages.

\* cited by examiner

METHOD FOR VERTICAL GATE-LAST PROCESS

TECHNICAL FIELD

The present invention relates in general to the fabrication of vertical metal-oxide-semiconductor field-effect transistors (MOSFETs), and in particular to the fabrication of vertical nanowire MOSFETs in a self-aligned, gate-last process and their use in electronic circuits.

BACKGROUND

Vertical nanowire MOSFETs allow for small foot-prints of thin channels with good electrostatic control provided by the gate-all-around geometry. Reducing the nanowire diameter improves electrostatics and reduces the foot-print area, but has shown to increase the extrinsic series resistance. High-precision doping control along the axial direction of the nanowire has proven insufficient and very challenging. Thinner nanowire diameters also increase the metal-semiconductor contact resistance since a smaller area is contacted. Furthermore, ohmic contacts typically require a high temperature annealing process to achieve sufficient low specific contact resistivity, whereas the electrical and structural properties of the gate dielectric are sensitive to high temperature processes. Gate-last processes are often used in planar technologies, where the source- and drain regions and their electrical contacts are fabricated prior to the gate definition.

SUMMARY OF THE INVENTION

To address the issues mentioned above, a self-aligned, gate-last process is utilized, with the possibility for local reduction of the nanowire diameter in the gated region using digital etching, while allowing for intrinsic channel and doped contact regions. Furthermore, the process allows the fabrication of MOSFETs with varying gate lengths in parallel on the same sample.

With the above description in mind, then, an aspect of some embodiments of the present invention is to provide a technology, which seeks to mitigate, alleviate or eliminate one or more of the above-identified deficiencies in the art and disadvantages singly or in any combination.

An aspect of the present invention relates to the technology where the top ohmic contact is fabricated prior to the gate formation.

Another aspect of the present invention relates to relates to the fabrication of vertical MOSFETs where the top metal electrode first is deposited and then used as an etching mask to reduce the diameter of the nanowire transistor channel prior to gate definition.

Yet another aspect of the invention relates to the formation of the top contact region using a replacement mask that is used as an etching mask to reduce the diameter of the nanowire transistor channel prior to gate definition. This replacement mask is later removed and replaced with a metal contact.

In yet another embodiment, the vertical nanowire MOSFETs, fabricated in a gate-last process, are used in digital applications where one or several nanowires are connected in groups forming circuits.

In yet another embodiment, the vertical nanowire MOSFETs, fabricated in a gate-last process, are used in RF- or millimeter wave applications where one or several nanowires are connected in groups forming circuits.

In yet another embodiment, the vertical nanowire MOSFETs, fabricated in a gate-last process, are used in mixed-mode or memory applications where one or several nanowires are connected in groups forming circuits.

Another aspect of the invention relates to the formation of vertical MOSFETs fabricated with the gate-last process, where the gate length is varied among the MOSFETs on the same sample.

Another aspect of the invention relates to the formation of vertical Tunnel Field-Effect-Transistors (FETs) fabricated with the gate-last process, where the nanowire consists of an axial pn-junction and the gate is aligned to the junction to implement the Tunnel FET.

The features of the above-mentioned embodiments can be combined in any combinations.

BRIEF DESCRIPTION OF THE DRAWINGS

Further objects, features and advantages of the present invention will appear from the following detailed description of the invention, wherein embodiments of the invention will be described in more detail with reference to the accompanying drawings, in which.

DETAILED DESCRIPTION

Figure 1:
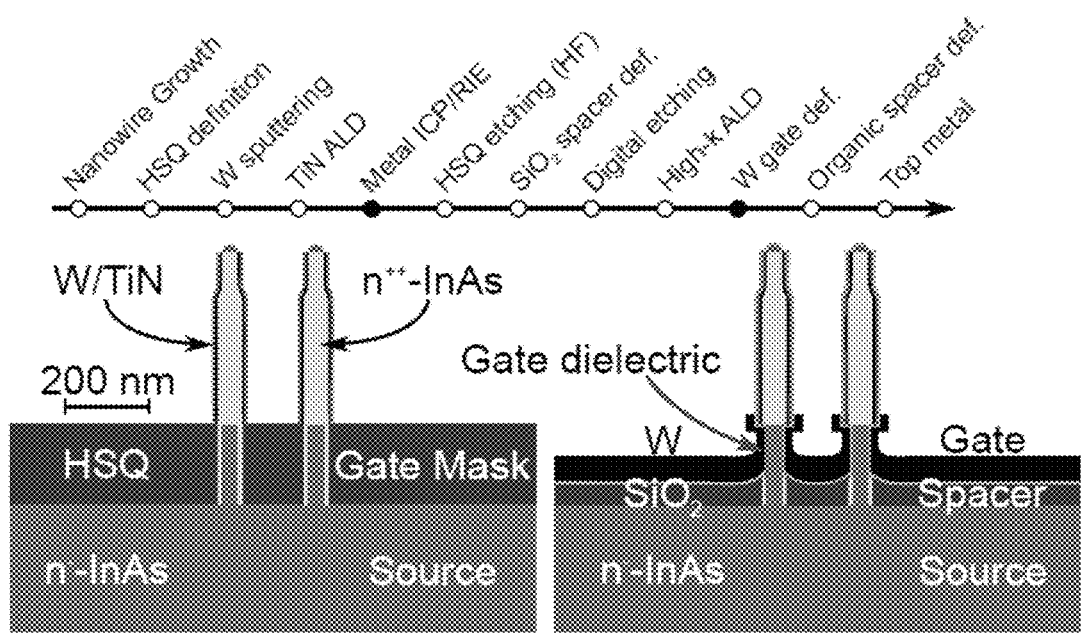
FIG. 1 Schematic illustration of vertical MOSFETs fabricated in the gate-last process.
Figure 2:
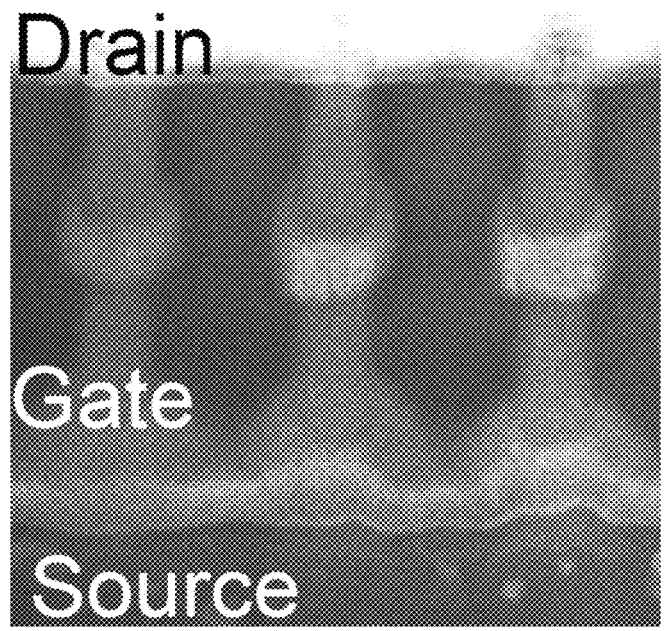
FIG. 2 SEM micrograph of vertical nanowire MOSFET.
Figure 3:
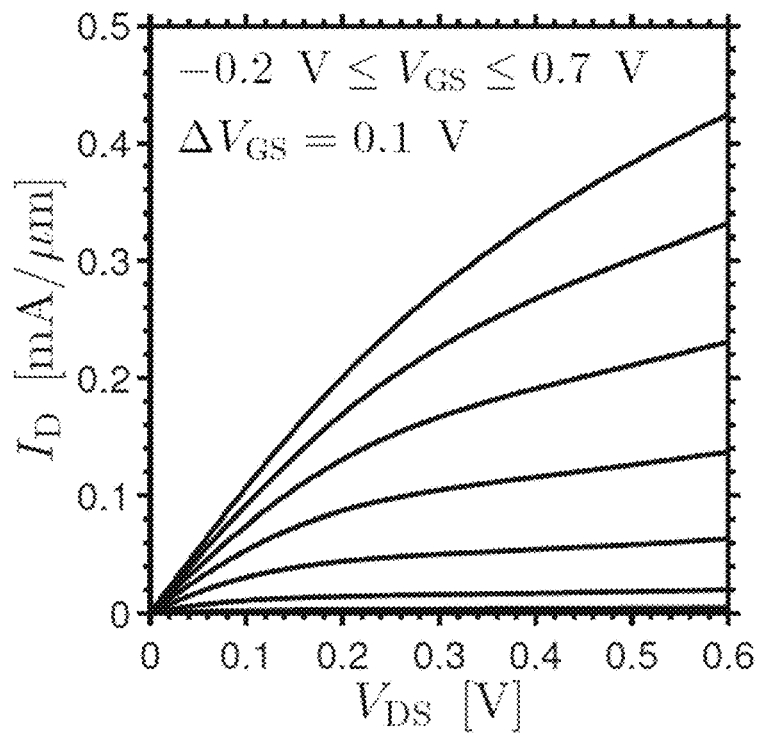
FIG. 3 Measured output characteristics of vertical nanowire MOSFET.
Figure 4:
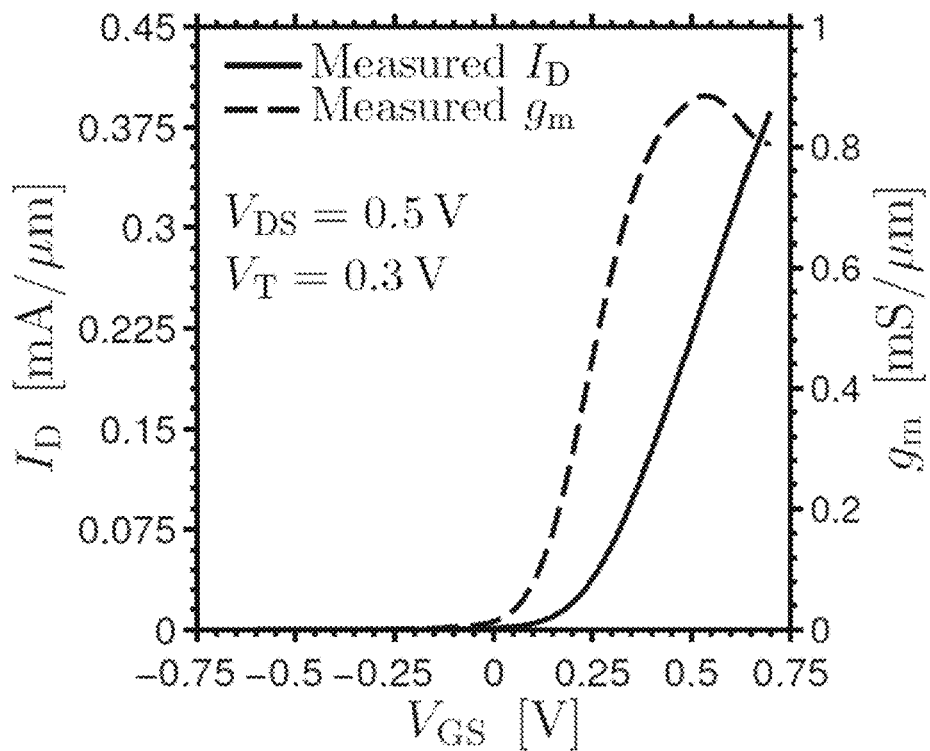
FIG. 4 Measured transfer characteristics of vertical nanowire MOSFET.

Embodiments of the present invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference signs refer to like elements throughout.

The nanowire MOSFETs are fabricated on semiconductor substrates (such as Si or III-V compound material). The nanowires may be grown either directly on the substrate or on an epitaxial layer deposited on the semiconductor wafers. III-V or group IV nanowires (such as InAs, InGaAs, GaSb, Si and combinations thereof) may be grown using metal organic vapor-phase epitaxy using the vapor-liquid-solid method on electron-beam defined Au particles. Alternatively, other methods to grow the nanowires may be used, such as growth on substrates with dielectric ($SiO_2$ or $SiN_x$) masks. The nanowires may also be defined by etching of the semiconductor wafer in a top-down process. Furthermore, the nanowires may be exposed to a regrowth step, where one or more masks are used along the nanowires to allow for semiconductor material deposition in one, two, or more areas along the nanowires. The nanowires may be arranged in certain configurations, such as in double row arrays with 200 nm spacing or in hexagonal patterns. The nanowires may further be homogenous in material composition and doping level or they may be formed by axial segments of varying doping or material composition, such as a 200 nm long undoped bottom section followed by a 400 nm long highly doped section. For Tunnel FETs, the nanowires may consist of GaSb/InAs pn-junctions where the gate is located in the direct vicinity of the heterojunction. The nanowires may further contain radial heterostructures or doping variation formed in core/shell heterostructures, such as an intrinsic InAs (or InGaAs) core overgrown by a highly doped InAs (or InGaAs) shell. Nanowires may in this context refer to semiconductor rods consisting of one single material or alternatively of core/shell nanowires where a second material has been epitaxial grown on the side facets of the first nanowire with the goal of providing enhanced functionality such as channel access resistance, reduced strain for transport enhancement, or surface passivation. Alternatively, we may also consider axial heterostructure nanowires where segments of two or more different materials and doping levels have been combined within the nanowire. These nanowires may be used as transistor channels in vertical MOSFETs where an upper electrode is formed on the top of the nanowire and serves as an ohmic contact to the nanowire. The electrode may consist of a metal contact as well as a semiconductor contact region. The gate is located below the upper electrode whereas the third electrode is located below the gate or on the substrate in connection to the nanowire. The third electrode serves as a second ohmic contact to the transistor.

In a first embodiment of the present invention, the upper ohmic transistor electrode is formed prior to the gate formation.

In a first step, the bottom of the nanowires is protected by one or several organic or inorganic layers, such as Hydrogen silsesquioxane (HSQ), SiNx, SiO2, BCB, photoresists. To achieve gate length control, the layer thickness is controlled around each nanowire, for instance via the control of the exposure dose or by local thinning of the layer by etching or by local addition of material by deposition. A top metal contact is formed by metal deposition, such as sputtering of 20 nm W and atomic layer deposition (ALD) of 5 nm TiN, or deposition of Ni. This metal is etched anisotropically for instance by dry etching, removing the planar layer and only keeping the metal on the nanowire sidewalls. The protection layer is then removed.

In a second step, an organic or inorganic spacer layer, such as SiO2, is deposited where the thickness of this layer is thinner than the first protection layer.

In a third step, a high-K oxide, for instance deposited by atomic layer deposition, for instance consisting of Al2O3, HfO2, ZrO2, or combination thereof, is deposited.

In a fourth step a metal gate is deposited by for instance sputtered W. The metal gate length is thereby finally defined, whereas the gate-drain and gate-source spacings are defined by the thicknesses of the protection layer and the spacer layer, respectively.

The transistor process is then completed in a fifth step by contacting the gate and the transistor top ohmic contact separately as well as the formation of the bottom electrode.

In a second embodiment, the upper ohmic transistor electrode is formed prior to the gate formation.

In a first step, an ohmic contact is deposited below the gate region of the transistors.

In a second step, the region above the bottom ohmic contact is protected by an organic or inorganic layer, such as Hydrogen silsesquioxane (HSQ), SiNx, SiO2, BCB, photoresists. To achieve gate length control, the layer thickness is controlled around each nanowire, for instance via the control of the exposure dose or by local thinning of the layer by etching or by local addition of material by deposition. A top metal contact is formed by metal deposition, such as by sputtering of 20 nm W and atomic layer deposition (ALD) of 5 nm TiN or deposition of Ni. This metal is etched anisotropically for instance by dry etching, removing the planar layer and only keeping the metal on the nanowire sidewalls. The protection layer is then removed.

In a third step, an organic or inorganic spacer layer, such as SiO2, is deposited where the thickness of this layer is thinner than the first protection layer.

In a fourth step, a high-K oxide, for instance deposited by atomic layer deposition, for instance consisting of Al2O3, HfO2, ZrO2, or combination thereof, is deposited.

In a fifth step a metal gate is deposited, for instance by sputtered W. The metal gate length is finally defined, whereas the gate-drain and gate-source spacings are defined by the thicknesses of the protection layer and the spacer layer, respectively.

The transistor process is then finally completed in a sixth step by contacting the gate and the transistor top ohmic contact separately as well as the formation of the bottom electrode.

In a third embodiment, the upper ohmic transistor electrode is formed prior to the gate formation.

In a first step, the bottom of the nanowires is protected by an organic or inorganic layer, such as Hydrogen silsesquioxane (HSQ), SiNx, SiO2, BCB, photoresists. To achieve gate length control, the layer thickness is controlled around each nanowire, for instance via the control of the exposure dose or by local thinning of the layer by etching or by local addition of material by deposition. A top metal contact is formed by metal deposition, such as by sputtering of 20 nm W and atomic layer deposition (ALD) of 5 nm TiN, or deposition of Ni. This metal is etched anisotropically for instance by dry etching, removing the planar layer and only keeping the metal on the nanowire sidewalls. The protection layer is then removed.

In a second step, an organic or inorganic spacer layer, such as SiO2, is deposited where the thickness of this layer is thinner than the first protection layer.

In a third step, the nanowires are etched using the top electrode and the spacer layers as masks, forming a recess region. Digital etching of the nanowires using alternating O3 oxidation and HCl:H2O (1:10) may be used. A highly doped shell may in this way be etched locally on a section of the nanowire and the diameter is trimmed to wanted dimensions (3-50 nm).

In a fourth step, a high-K oxide, for instance deposited by atomic layer deposition, for instance consisting of Al2O3, HfO2, ZrO2, or combination thereof, is deposited.

In a fifth step a metal gate is deposited, for instance by sputtered W. The metal gate length is finally defined, whereas the gate-drain and gate-source spacings are defined by the thicknesses of the protection layer and the spacer layer, respectively.

The transistor process is then completed in a sixth step by contacting the gate and the transistor top ohmic contact separately as well as the formation of the bottom electrode.

In a fourth embodiment, the extension of the upper ohmic transistor electrode is defined prior to the gate formation.

In a first step, the bottom of the nanowires is protected by an organic or inorganic layer, such as Hydrogen silsesquioxane (HSQ), SiNx, SiO2, BCB, photoresists. To achieve gate length control, the layer thickness is controlled around each nanowire, for instance via the control of the exposure dose or by local thinning of the layer by etching or by local addition of material by deposition. The top contact is defined by isotropic deposition of a mask, such as SiNx or SiO2. This mask is etched anisotropically for instance by dry etching, removing the planar layer and only keeping the mask on the nanowire sidewalls. The protection layer is then removed.

In a second step, an organic or inorganic spacer layer, such as SiO2, is deposited where the thickness of this layer is thinner than the first protection layer.

In a third step, the nanowires are etched using the top electrode and the spacer layers as masks, forming a recess region. Digital etching of the nanowires using alternating O3 oxidation and HCl:H2O (1:10) may be used. A highly doped shell may in this way be locally etched on a section of the nanowire and the diameter is trimmed to wanted dimensions (3-50 nm).

In a fourth step, a high-K oxide, for instance deposited by atomic layer deposition, for instance consisting of Al2O3, HfO2, ZrO2, or combination thereof, is deposited.

In a fifth step a metal gate is deposited, for instance sputtered W. The metal gate length is finally defined, whereas the gate-drain and gate-source spacings are defined by the thicknesses of the protection layer and the spacer layer, respectively.

The transistor process is then completed in a sixth step by contacting the gate and defining the transistor top ohmic contact by metallization, separately as well as the formation of the bottom electrode.

A particular benefit of the presented embodiments is the control of the gate length that can be defined by the thickness of the first protection layer. However, it is understood that the same effect will be obtained if the thickness of the spacer layer is varied whereas the thickness of the protection layer is kept constant. Similarly, the thickness of both layers may be varied among the transistors.

It is also understood that the protection layer and the spacer layer described in the provided embodiments in fact may consist of multi-layer structures that combined will act as the layers described.

A particular benefit of the invention is that the ohmic contacts may be annealed prior to gate definition. When Ni is used as contact metal, this particular benefit may be used to form Ni-alloys in the contact regions that are further used to reduce the access resistance.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that variations may be made in those embodiments by those skilled in the art without departing from the scope of the present invention as defined by the following claims.

The invention claimed is:

1. A method for fabricating a vertical nanowire MOSFET on a semiconductor substrate having at least one nanowire, the method comprising:
    depositing a protection layer around a bottom of the nanowire;
    forming a top metal contact by metal deposition;
    removing the protection layer;
    depositing a spacer layer, wherein a thickness of the spacer layer is smaller than a thickness of the protection layer;
    depositing a high-k oxide;
    depositing a metal gate;
    contacting the metal gate and the top metal contact separately; and
    forming a bottom electrode.

2. The method according to claim 1, wherein the top metal contact is formed prior to depositing the metal gate.

3. The method according to claim 1, wherein method further comprises:
    forming a recess region in the nanowire by etching using the top electrode and the spacer layer as masks, wherein the forming of the recess region is performed prior to the act of depositing the high-k oxide.

4. The method according to claim 1, wherein forming the top metal contact includes sputtering of 20 nm W, atomic layer deposition of 5 nm TiN, or deposition of Ni.

5. The method according to claim 1, wherein the protection layer comprises: hydrogen silsesquioxane (HSQ), $SiN_X$, $SiO_2$, BCB, or photoresist.

6. The method according to claim 1, wherein the protection layer is hydrogen silsesquioxane (HSQ), and the act of removing the protection layer consists of etching said protection layer using HF.

7. The method according to claim 1, wherein the high-k oxide is deposited by using atomic layer deposition.

8. The method according to claim 1, wherein the high-k oxide consists of $Al_2O_3$, $HfO_2$, $ZrO_2$, or combination thereof.

9. The method according to claim 1, wherein the semiconductor substrate is made of Si or III-V compound material.

10. The method according to claim 1, wherein the nanowire is a III-V or group IV nanowire.

11. A vertical nanowire MOSFET fabricated using a method according to claim 1.

12. Use of a vertical nanowire MOSFET according to claim 3 in digital applications where one or several nanowires are connected in groups forming circuits.

13. Use of a vertical nanowire MOSFET according to claim 3 in RF- or millimeter wave applications where one or several nanowires are connected in groups forming circuits.

14. Use of a vertical nanowire MOSFET according to claim 3 in mixed-mode or memory applications where one or several nanowires are connected in groups forming circuits.

15. The method according to claim 4, wherein the act of forming the top metal contact further comprises:
    etching the deposited metal anisotropically to remove planar portions of the deposited metal.

* * * * *